Nov. 27, 1951 L. W. IMM 2,576,903

ELECTRICAL SWITCHING MECHANISM

Filed March 4, 1950 4 Sheets-Sheet 1

Inventor

LEWIS W. IMM

By

Naylor and Lassagne

Attorneys

Nov. 27, 1951 L. W. IMM 2,576,903

ELECTRICAL SWITCHING MECHANISM

Filed March 4, 1950

4 Sheets-Sheet 2

INVENTOR.
LEWIS W. IMM
BY
Naylor and Lassagne
ATTORNEYS

Nov. 27, 1951 L. W. IMM 2,576,903

ELECTRICAL SWITCHING MECHANISM

Filed March 4, 1950 4 Sheets-Sheet 3

Inventor

LEWIS W. IMM

By

Naylor and Lassagne

Attorney

ELECTRICAL SWITCHING MECHANISM

Filed March 4, 1950

4 Sheets-Sheet 4

INVENTOR.
LEWIS W. IMM
BY
Naylor and Lassagne
ATTORNEYS

Patented Nov. 27, 1951

2,576,903

UNITED STATES PATENT OFFICE 2,576,903

ELECTRICAL SWITCHING MECHANISM

Lewis W. Imm, Los Angeles, Calif., assignor to Librascope, Incorporated, Glendale, Calif., a corporation of California Application March 4, 1950, Serial No. 147,678

6 Claims. (Cl. 171—97)

The present invention relates to automatic electrical switching mechanism adapted for use in automatic tuning mechanisms for radio receivers, television receivers, and the like. Due to the wide variety of programs nowadays offered on television and radio broadcasts, it has become desirable to have automatic tuning mechanisms permitting pre-selection of a desired sequence of programs for extended periods of time, such as for a whole evening, a whole day or even a whole week, so that a receiver may automatically and at the proper moment be tuned to whatever station the owner may wish to listen at a particular time.

Devices of this type employ usually clock-actuated recording tapes that are divided into longitudinal columns which represent the various broadcasting stations to which a person may wish to listen, and which are longitudinally subdivided into desired time intervals, such as quarter-hour periods. A particular program selection may be recorded on said tape by punching holes in the fields that represent a particular station and a particular time; and by passing the marked tape in properly timed relation past a set of contact fingers, each representing a desired station, normally interrupted electrical circuits may be closed when a contact finger encounters a hole in the tape; the fingers being adapted upon energization to tune an associated receiver to the particular station that is represented by said contact finger.

Broadly, it is an object of the present invention to provide an improved automatic tuning device for radio receivers, television receivers and the like which is capable of tuning such receivers accurately and at the proper times to a preselected sequence of stations.

Another object of the invention is to simplify the construction of tape-controlled automatic tuning devices of the kind referred to.

Yet another object of the invention is to so arrange a device of the type referred to as to provide for the inclusion of a maximum number of control perforations in a minimum length of tape without impairing the accuracy and dependability of the tuning operation controlled by said perforations.

An additional object of the invention is to eliminate the necessity for providing "on" and "off" perforation fields separate from the tuning perforation fields in the practical performance of a device of the type referred to.

Furthermore, it is an object of the present invention to provide a device of the type referred to that is of compact design so as to require but little space in a radio cabinet or the like.

These and other objects of my invention will be apparent from the following description of the accompanying drawings which illustrate certain preferred embodiments thereof and wherein, Figure 1 is a circuit diagram of a tape controlled automatic tuning device constructed in accordance with the invention and associated with a radio receiver of the type that is tuned by the switching of a selected one out of a plurality of available condensers into the tuning circuit thereof;

Figure 8 is a plan view of the apparatus illustrated in Figure 7; and

Figure 9 is a detail view illustrating part of the apparatus shown in Figure 8 by way of a vertical section taken along line 9—9 of said figure and viewed in the direction of the arrows associated with said line.

Figure 1:
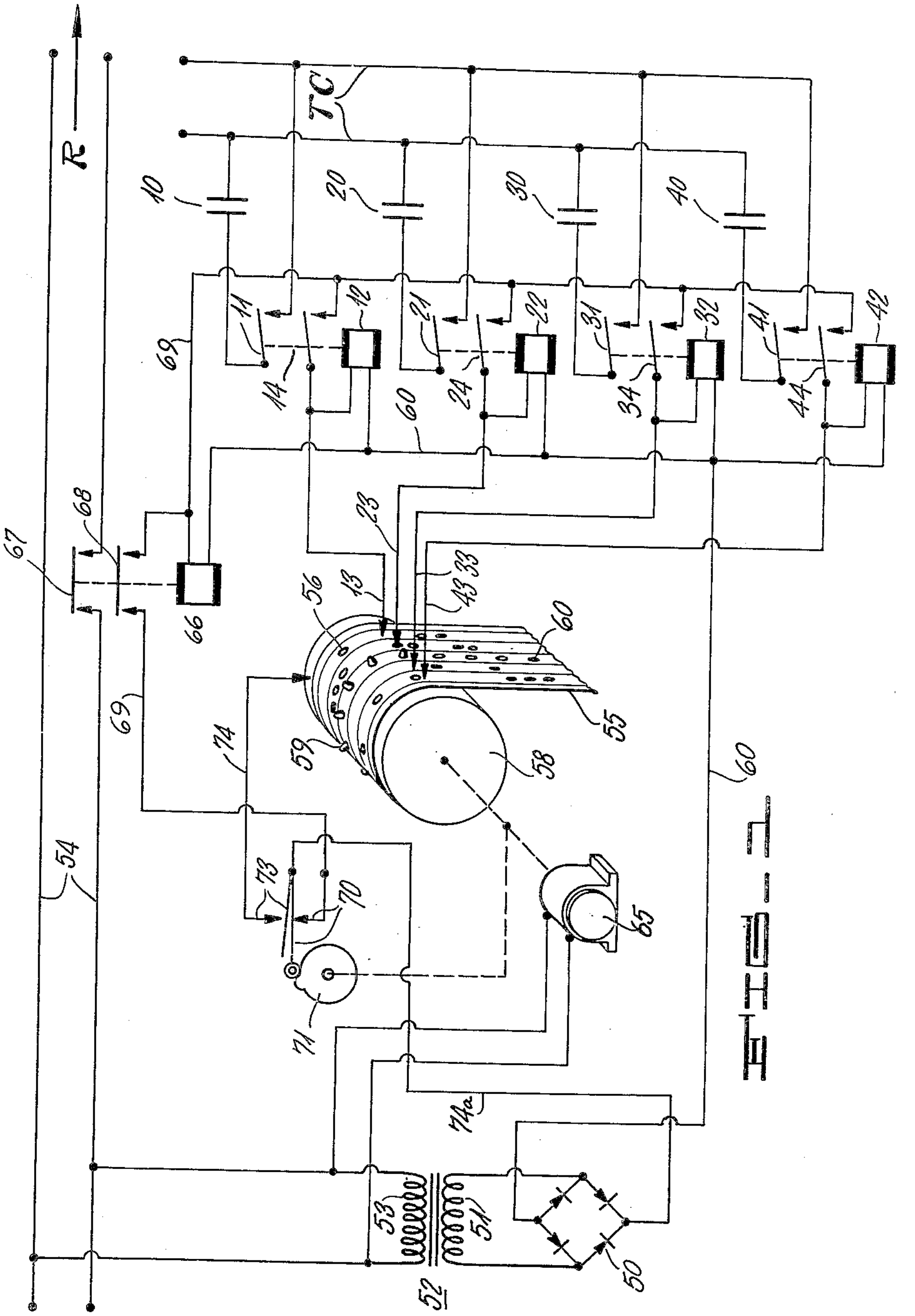

Having first reference to Figure 1, the leads TC represent the tuning circuit of a radio receiver that may selectively be tuned to four different broadcasting stations by switching any one of four different condensers 10, 20, 30 and 40 into said tuning circuit. For this purpose each of said condensers may individually be switched across the leads TC by normally open switches 11, 21, 31 and 41, respectively. Normally deenergized relays 12, 22, 32 and 42, one associated with each of said switches, are arranged upon energization to close said switches, and said relays may be individually connected across a suitable source of D. C. voltage, such as the rectifier 50, that is shunted across the secondary 51 of a step-down transformer 52 the primary 53 of which is connected across the leads of the main power line 54. Ordinarily, however, the connection between the source of power and the individual relays is interrupted by a selector including a program control element such as a tape 55 of insulating material, such as paper, and may be closed or reopened in accordance with a pattern of holes or perforations 56 which the owner of the radio set may have punched into said tape to record a particular program selection.

Figures 2, 3:
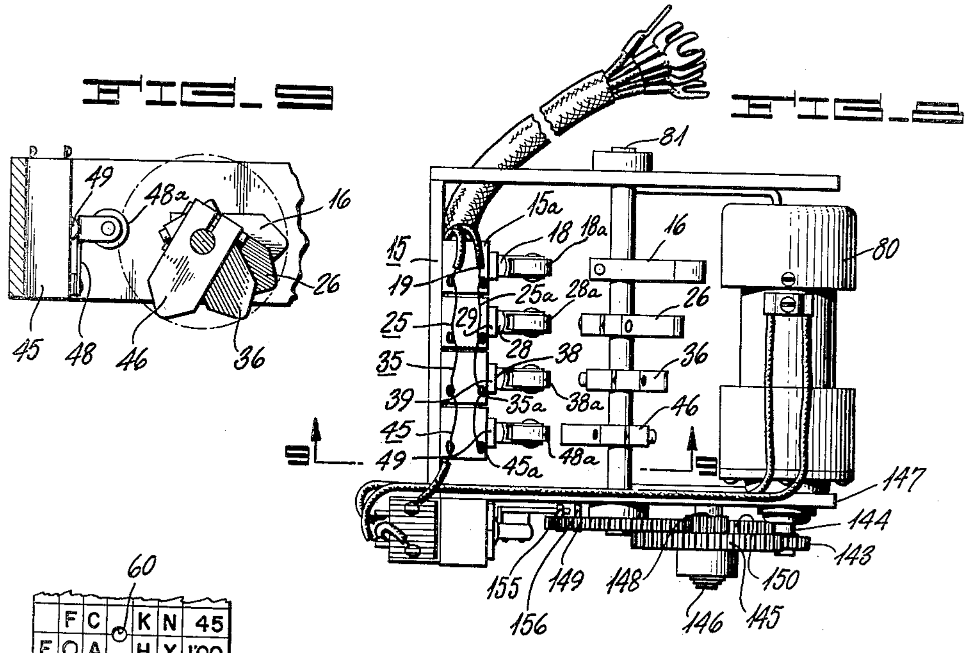
Figure 2 illustrates a portion of the program tape employed in the device of the invention.
Figure 3 is a circuit diagram similar to Figure 1, representing an automatic tuning device constructed in accordance with the invention and associated with a radio receiver of the type that is tuned by manipulation of a variable condenser.

Having specific reference to Figure 2, said tape 55 has marked thereon four longitudinal columns F, C, K and N, each representing a particular broadcasting station. In addition the tape is subdivided by numerous transverse lines 57 into equal time intervals of preferably fifteen minutes each, as indicated in the left marginal column of said tape. The right marginal column of the tape is used to mark out larger time intervals, such as the days of the week or the pre- and after-meridial halves of the days. It will be understood that a program selection may easily be recorded on said tape for a full day, a week or even a month, depending upon the length of the program tape, by punching holes into selected ones of the fields formed by the columns that represent the stations and the transverse lines which mark the time in fifteen minute intervals.

Reverting to Figure 1, the described program tape 55 is trained around and driven by a drum or cylinder 58 of a metallic conductive material that possesses a wreath of sprocket teeth 59 arranged centrally around its peripheral surface which engage a row of corresponding perforations 60 provided along the center line of the tape (Figure 2). Arranged for sliding contact with the outer surface of the tape 55 as it engages and is advanced by said drum, are four contact fingers 13, 23, 33 and 43, each aligned with one of the station columns marked on the tape and conductively connected with one terminal of the particular relay 12, 22, 32 or 42, respectively, that is adapted to switch the particular condenser 10, 20, 30 or 40 into the tuning circuit TC which will tune the radio set to the station represented by said column; a common lead 61 connects the other terminals of all of said relays to one terminal of the source of power 50, as shown.

A synchronous motor 65 is arranged to turn the drum 58 at a speed corresponding to the "station-change" intervals marked on the program tape 55; that is to say, if the distance between two transverse lines 57 represents a time interval of, say, fifteen minutes, as previously indicated, the drum is arranged to advance the tape over said distance in exactly fifteen minules. Thus, whenever one of the contact fingers 13, 23, 33 or 43 encounters a hole 56 in the tape 55 and through said hole contacts the conductive drum 58 underneath, it partially closes a circuit through its respective relay, so that whenever the drum 58 is connected to the opposite terminal of the source of power 50, the switch that tunes the radio receiver to the particular station represented by the column within which the particular hole is situated will be closed.

Means including an activating switch are provided for transiently energizing the drum 58 at intervals corresponding to the aforesaid station-change intervals. This means comprises a conductor 74 having a permanent connection with drum 58 and adapted to be connected through an activating switch 73 and conductor 74a with the terminal of the source of power 50 opposite that to which the fingers 13, 23, 33 and 43 are connected as previously described. The synchronous motor 65 which turns drum 58 also turns a cam 71 which closes activating switch 73 at intervals corresponding to said station change intervals, reopening said switch substantially immediately, since the relays involved will operate instantly.

Aside from operating tuning switches, the relays 12, 22, 32 and 42 are arranged, upon energization as above described, to close additional switches 14, 24, 34 and 44, respectively, all of which are adapted to connect an additional relay 66 across the source of voltage 50. Said relay 66 in turn is arranged upon energization to close two switches 67 and 68, respectively. The switch 67 is arranged to control the power supply to the radio set and for this purpose may be situated within one of the leads of the previously mentioned power supply line 54. Thus, whenever one of the tuning control relays 12, 22, 32 or 42 is activated by switch 73, its respective contact finger having encountered a perforation 56 in the program tape 55, said relay is not only effective to tune the radio receiver to a predetermined station in the manner previously described, but in addition turns on the radio receiver by activating the relay 66 which closes the power supply switch 67.

The second switch 68 is arranged upon closing to perpetuate the conditions established by energization of a tuning relay for a period equal to the individual time intervals marked out on the program tape, even though the steady advance of said tape will move the perforation that initiated the above-described sequence of operations, beyond the contact finger and thus interrupt the flow of current through the initially activated tuning relay. For this purpose said switch 68 is arranged to partially close a holding circuit 69 which connects the power control relay 66 and any activated tuning relay through its associated switch 14, 24, 34 or 44, respectively, across the source of voltage 50, independently of any connection established by contact fingers through a perforation in the program tape 55. Completion of closing of the holding circuit is accomplished by means including a second switch 70 which constitutes a holding switch and is actuated by the cam 71 so as to be closed just prior to the opening of activating switch 73 by said cam, such timing of its closure being important because if activating switch 73 should be opened before closure of holding switch 70, the relay 66 would be deenergized and its armature 68 would interrupt the holding circuit. Equivalently, however, the employment of a delayed action relay, as relay 66, would avoid the necessity for so timing the opening of activating switch 73 with the closing of holding switch 70. With either arrangement both the initially activated relays, i. e., the tuning relay and the power control relay, remain energized after the particular perforation that initiated the described sequence of operations has advanced beyond the reach of its correlated contact finger, and in this manner the receiver is maintained in operative condition and tuned to the station represented by said first encountered perforation.

After a quarter hour's performance, however, the described arrangement must be restored to a condition in which the program tape 50 may resume control of the tuning circuit and the power supply of the radio receiver in order that the receiver may be tuned to another station if there is a perforation in another station column of the program tape, or may be completely turned off if there is no perforation whatsoever within the space representing the next fifteen minutes.

For this purpose the normally closed holding switch 70 is opened momentarily at the predetermined station change intervals corresponding to the time intervals marked on the program tape 55; that is to say, in the embodiment of the invention which I am about to describe, the cam 71 is arranged to open the holding switch 70 every fifteen minutes for a very brief period of time. Unless there is a perforation in position to permit one of the fingers 13, 23, 33, 43 to contact drum 58 whenever said holding switch 70 is opened, current will cease to flow through the relay 66 and switches 67 and 68 will open. The power supply to the radio receiver is thus turned off and the interruption of the holding circuit 69 temporarily effected by switch 70 is rendered permanent. In addition current ceases to flow through whatever tuning relay was initially energized so that both the switches controlled by said tuning relay open. This cuts the tuning capacity controlled by said relay from the tuning circuit of the radio receiver and in addition breaks the holding circuit 69 at a third place. Hence when the rotary timing cam 71 permits the switch 70 to close again, the same conditions are established in the described system that existed initially.

Under these conditions, if there is no new perforation in the tape opposite to any one of the feeler fingers, the radio set will simply terminate performance and remain silent for at least another fifteen minutes. However, if there is a perforation in the tape which establishes contact between the drum and any of the feeler arms at this moment, the previously described sequence of switching operations is again initiated and will instantly tune the set to a new or to the same station, as the case may be, and supply it with power, and thereafter maintain these settings automatically for a time interval of fifteen minutes in the manner previously described. Thus, the arrangement of my invention is such that it does not require special "on" perforation fields on the program tape to commence operation of the receiver whenever the automatic tuning control device has set the tuning means of the receiver to a desired station; nor are special "off" perforation fields required to terminate operation of the receiver whenever a program has been completed and the contact fingers encounter no perforations in the subsequent time interval marked on said tape.

To avoid any interruption in the performance of the radio receiver that may be caused by the above-described resetting and retuning operations and which may be especially annoying in programs that extend over several fifteen minute intervals, the control cam 71 is preferably arranged to close switch 73 shortly before it opens switch 70, as well as to maintain said switch 73 in closed position until the switch 70 has again been closed, as previously described. Thus, if the new time interval on the program tape contains a hole in the column that contained the hole which determined the initial setting of the radio set, the current supply to the active tuning relay is uninterruptedly maintained through switch 73, the conductive cylinder 58 and the feeler finger that engages said new hole during the brief period when the timing cam 71 opens the resetting switch 70. Hence, the capacity controlled by said relay is kept in the tuning circuit of the radio set and the power supply to the set is maintained without any interruption, so that there will be no disturbance of the program as the automatic resetting switch 70 tests the setting of the radio receiver every 15 minutes against the program recorded on the tape 50.

An additional advantage of the described operation of the switch 73 at accurately timed station-change intervals is the re-tuning of the receiver to a new station at exactly the moment when said switch 73 is being closed, for previously inactive tuning relays cannot be energized to tune the radio set to a new station until switch 73 is closed, since no current can previously reach the tuning relays even though an inaccurately placed perforation in the tape may prematurely have established contact between the conductive drum and a feeler finger. Thus, the exact position of a perforation in the tuning tape is immaterial for the commencement of a new program, and there is no danger that a badly placed perforation may start operation of another tuning relay and switch another tuning condenser into the tuning circuit of the radio set before the condenser that tuned the radio to a previously selected station has been cut out. Hence, the time intervals marked on the program tape may be made very narrow and the program drum be operated at a very low speed permitting a maximum number of control perforations to be recorded on a given length of tape without impairing the accuracy and dependability of the tuning operations controlled by said perforations.

The automatic radio control arrangement illustrated in Figure 3 is in principle the same as the arrangement illustrated in Figure 1 described in detail hereinbefore, and equivalent components in both arrangements are therefore identified by the same reference numerals. The arrangement illustrated in Figure 3 differs from the arrangement illustrated in Figure 1 in that the automatic tuning control mechanism of the former is adapted for operation with a radio receiver that is tuned by means of a variable condenser, while the automatic tuning control mechanism of the latter is adapted for operation with a radio receiver that is tuned by the addition of selected ones out of a plurality of fixed condensers into its tuning circuit. Hence, while in the initially described arrangement the contact fingers 13, 23, 33 and 43 are arranged to close circuits for relays that switch condensers into the tuning circuit of the radio set, the contact fingers 13, 23, 33 and 43 of the arrangement illustrated in Figure 3 are all adapted to connect a reversible D. C. motor 80 separately across the source of voltage 50. Said motor drives the shaft of a variable tuning condenser (not shown) so that said condenser is turned whenever a hole in the program tape 55 establishes contact between the revolving drum 58 and one of the contact fingers 13, 23, 33 or 43.

Means are provided to arrest the operation of the motor 80 whenever the variable condenser has been turned to a point where it tunes the radio set to the station represented by the program tape column in which the hole is located that initiated operation of the tuning motor. For this purpose, each of the separate power circuits that may be established through the tuning motor 80 by the various contact fingers contains a normally closed motor stop switch 15, 25, 35 and 45, respectively, and said motor 80 is arranged to drive a tuning control shaft 81 represented by a broken line in Figure 3, upon which are mounted four control cams 16, 26, 36 and 46, respectively, that are adapted to open the switches 15, 25, 35 and 45, respectively, in angularly displaced positions corresponding to the different angular positions which the rotor of the tuning condenser must assume in setting the radio set to the stations marked out on the program tape. Thus, whenever a particular contact finger initiates operation of the tuning motor, said motor will operate until the normally closed motor stop switch connected to said particular contact finger is thrown open by its associated control cam, whereupon the motor, the control shaft and the condenser shaft will come to a halt with the condenser in a position that tunes the radio set to the desired station.

The tuning motor 80 is of the reversible type, as previously indicated, and is associated with a reversing switch 82 that is adapted upon actuation to connect the motor directly and in opposite polarity across the source of voltage 50. An actuating arm 83 secured to the cam shaft 81 is arranged to actuate said switch and thus reverse the motor whenever said shaft has made a complete revolution from a predetermined initial position. Thus, if the program tape 50 directs the described tuning control mechanism to tune the radio set to a desired station from a position of the cam shaft 81 in which the actuating element of the control cam corresponding to said desired station has passed its correlated motor stop switch, the motor will operate in the initially assumed direction until the cam shaft reaches its full cycle position, at which moment the arm 83 actuates the switch 82 and reverses the operation of the motor. When the motor turns in opposite direction, the control cams 16, 26, 36 and 46 are unable to arrest its operation because the motor is now connected directly across the source of power 50 instead of through one of the stop switches 15, 25, 35 or 45, respectively. Thus, though the cams will consecutively open all the motor stop switches for brief periods of time, the motor will continue to operate until the cam shaft 81 has made a complete revolution and returns to its full cycle position; in this position the aforementioned arm 83 will again actuate the reversing switch 82 and re-connect the tuning motor in the initially described manner across the source of voltage through whatever motor stop switch has its associated contact finger in conductive contact with the program drum 58. As a result thereof the direction of operation of the tuning motor is again reversed and it will now turn in its original direction until the particular stop switch through which its power circuit is closed is thrown open by its associated control cam leaving the receiver tuned to the particular station represented by the column which contained the perforation that initiated the described tuning operations. In view of the described arrangement, all condenser settings are effected from one direction only, and since it is thus only necessary to make allowance for overthrow of the condenser shaft in one direction, the automatic tuning mechanism of my invention secures highest tuning accuracy with a minimum of components.

Referring again to Figure 3, the aforementioned motor stop switches 15, 25, 35 and 45 are two-way switches, as shown, in that their control arms are adapted to close individual circuits through the source of voltage 50 and the power control relay 66 whenever they are actuated by their respective control cams to interrupt the power circuit of the tuning motor 80. As in the case of the automatic tuning device illustrated in Figure 1, the relay 66 shown in Figure 3 is adapted, upon energization, to close the power switch 67 of the radio set and a holding switch 68 which completes a circuit 69 including conductor and switch 70 which is operated in the same way as in the embodiment of Figure 1 to maintain the relay 66 energized and thus maintain the receiver in operation after the perforation that initiated the above described sequence of tuning operations has passed its correlated contact finger and the circuit initially established through said control relay 66 is interrupted by reopening of switch 70 by cam 71.

The radio set is not energized until the tuning operations have been completed and is therefore silent while said tuning operations proceed. As in the arrangement described in Figure 1, the holding circuit 69 established by closure of switch 68 contains an ordinarily closed re-setting switch 70 which is momentarily thrown open at station change intervals by the timing cam 71 to place the automatic tuning mechanism into a condition where it may resume control of the receiver to switch it off if there should be no perforation in the next time interval of the program tape, or to tune it to another station if a perforation in another column of the program tape 50 should have moved into position opposite one of the contact fingers. The arrangement illustrated in Figure 3 also comprises the normally open switch 73 within the lead 74 which connects the conductive drum 58 to source of voltage 50, which switch is closed shortly before the resetting switch 70 is opened and is maintained in closed condition until said re-setting switch is closed again, to avoid interruption of a program that extends over a multiple of the time intervals marked on the program tape. In the case of the present embodiment it is important, however, that the cam 71 be proportioned so as to maintain switch 73 closed for a period long enough to maintain motor 80 in operation for the longest interval required to tune the condenser from one station to any other.

Figure 6:
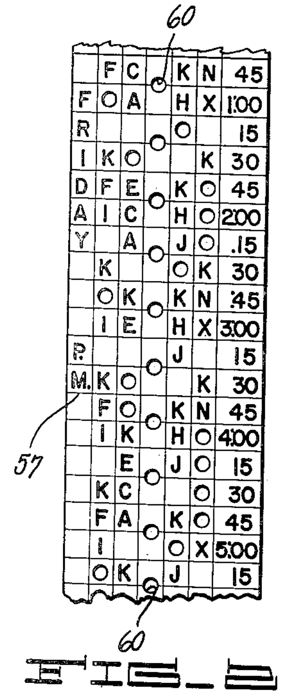
Figure 6 is a horizontal section through the same device taken along line 6—6 of Figure 5.
Figure 4:
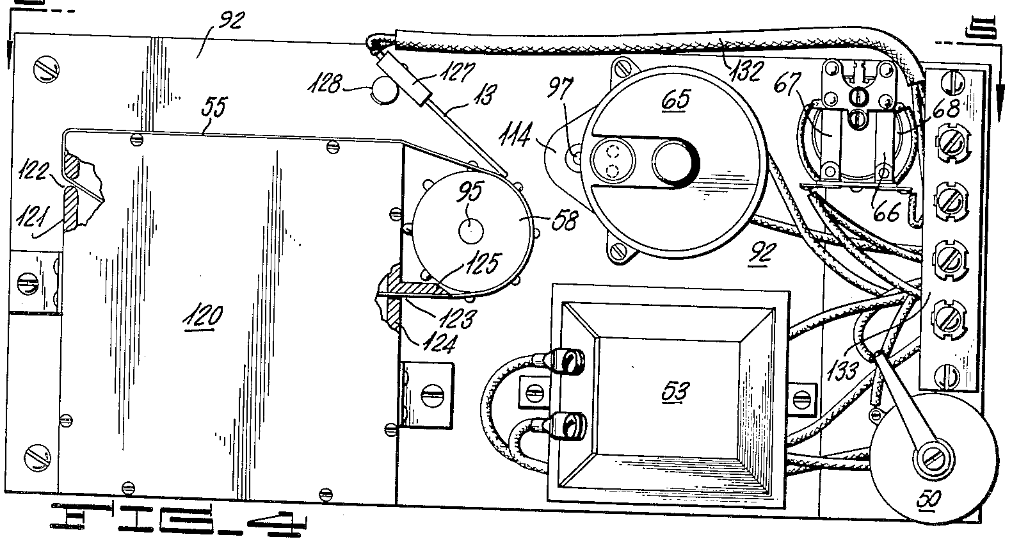
Figure 4 is a bottom plan view of a practical embodiment of the automatic tuning device represented by Figure 3.
Figure 5:
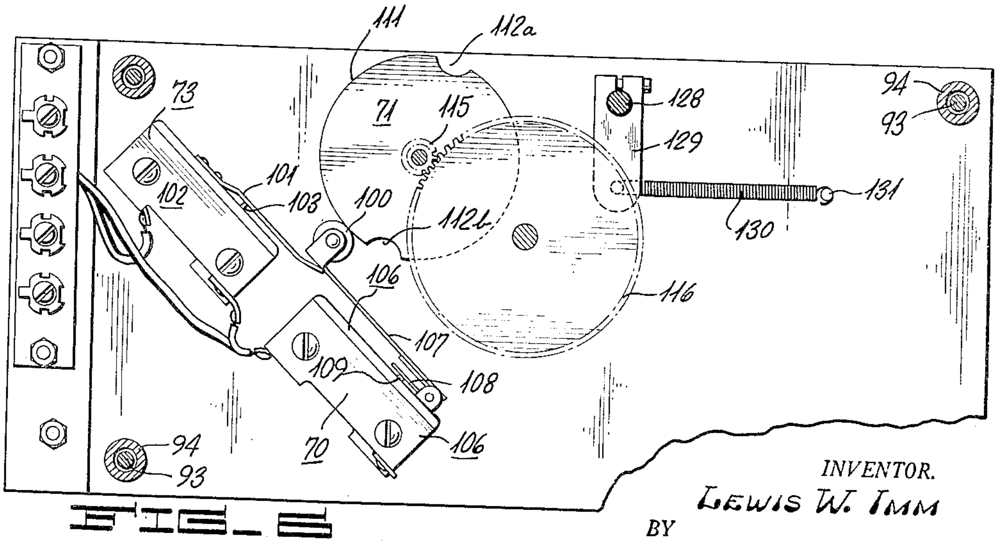
Figure 5 is a side elevation of the same device viewed in the direction of the arrows 5—5 in Figure 4.

Figures 4 to 9, inclusive, illustrated a practical device constructed in accordance with the embodiment of the invention illustrated in Figure 3 to control the performance of a radio receiver of the type tuned by a variable condenser. Said device comprises a chassis 90 composed of a pair of vertically spaced horizontal panels 91 and 92 that are connected at their four corners by studs 93 surrounded by spacer sleeves 94. Arranged below and supported from the lower panel 92 is the revolving drum or cylinder 58 which may be of aluminum or some other suitable material and which is firmly mounted upon a vertical shaft 95 that extends through both the panels 91 and 92 as shown in Figure 5. Likewise supported from the lower panel 92 is the synchronous motor 65 (Figure 4) which has a vertically disposed power take-off shaft 97 that also extends through both the panels 91 and 92. Keyed to said power shaft at a point intermediately of the panels 91 and 92 is the actuating cam 71 for the switches 70 and 73 which may likewise be located intermediately of the panels 91 and 92, as best shown in Figure 6. As previously explained, said switches are arranged to be jointly actuated by the cam 71 at predetermined intervals of say 15 minutes in such a manner that the switch 73 is closed slightly before the switch 70 is opened and is reopened a brief moment after switch 70 has been closed again.

For this purpose the switch 73, illustrated as a standard form of "Microswitch," is provided with a one-armed actuating lever 101 that is riveted at one end to the casing 102 of said switch and which bears with an intermediate point against a push button 103 that actuates a switch arm (not shown) which is spring biased to hold the switch in closed position. The switch 70, on the other hand, is provided with a two-armed actuating lever 105 of the bell crank type that is pivotally supported from the outer casing 106 of said switch. Said actuating lever 105 has a long arm 107 that overlies with its free end the free end of the aforementioned actuating lever 101, and a backwardly bent short arm 108 that bears with its free end against a push button 109 adapted to actuate a switch arm (not shown) which is spring biased to hold the switch 70 open.

Pivoted to the free end of the long lever arm 107 is a cam follower roller 110 that engages the edge of the aforementioned actuating cam 71. Said cam has a circular edge 111 that is interrupted by two rounded notches 112a and 112b provided at diametrically opposite points. The circular edge of the cam 71 is arranged to depress both the arm 107 of the actuating lever 105 and actuating lever 101 to such an extent that the push buttons 103 and 109 maintain the switches 70 and 73 in closed and open positions, respectively. However, when the cam follower roller 110 drops into one of said notches during rotation of the cam 71 the pressure against the switch actuating levers 105 and 101 is momentarily released, and the push buttons 103 and 109 are free to move into elevated positions in which switch 70 is open and switch 73 is closed.

Due to the fact that the lever arm 101 is shorter than the lever arm 107 and due to the fact that the distance between the free end of the former lever and the point where it bears against its associated push button 103 is shorter than the distance between the free end of the latter lever and the point where said latter lever bears against the push button 109, the described drop of the cam follower roller 110 into a notch 112a or 112b causes the lever arm 101 to rise over a greater angular distance than the lever arm 107, and hence permits the push button 103 to rise faster than the push button 109 so that the former will permit closure of its associated switch 73 a very brief moment earlier than the latter will permit opening of its associated switch 70; and vice versa as the cam follower roller 110 is forced to climb back onto the circular edge 111 of the cam 71 the push button 109 will close its switch 70 a very brief moment earlier than the push button 103 will open its switch 73. Hence, rotation of the cam 71 causes the switches 73 and 70 to close and open, respectively, in the order named whenever the cam follower roller 110 drops into one of the notches 112a or 112b, and will briefly thereafter cause said switches to close and open in the reverse order.

To effect the described switching operations in intervals of 15 minutes, the motor 65 is arranged to drive the switch-actuating cam 71 at a speed of half a revolution for every 15 minutes, for which reason a reduction transmission may be interposed between the motor and its power take-off shaft 97 which is encased in a flat oval housing that is partly visible at 114 in Figures 4 and 5.

The motor 65 is also arranged to drive the revolving drum 58 at a speed advancing it with every 15 minutes over an arc corresponding to the individual time intervals marked on the program tape 55. Since this requires an additional reduction in speed as compared with the speed of the switch-actuating cam 71, a small gear 115 is keyed to the power take-off shaft 97 of the motor at a point below the switch actuating cam 71 (Figures 5 and 6) and meshes with a large gear 116 that is keyed to the previously mentioned shaft 95 of the revolving program drum 58.

Bolted to the lower panel 91 of the chassis 90 at a place adjacent to the revolving drum 58 is a casing 120 of insulating material that may be of rectangular shape, as shown, and which is arranged to house and shelter the loose folds of the program tape 55. For this purpose the remote side wall 121 of the casing 120 is provided with a vertical slot 122 through which the program tape 55 is arranged to leave the interior of the casing 120 to be returned into said casing through another slot 123 provided in the side wall 124 that is nearest to the revolving drum. To disengage the tape 55 from the sprocket teeth of the drum 58 as it is fed back into the casing 120, a lip 125 of insulating material may project outwardly from below slot 123 adjacent the surface of the drum, as shown in Figure 4. If desired, the tape 55 may be formed in a continuous loop having a week's program selections punched therein. Such a loop may be fed continuously through the casing 120 and with pre-folding occupies little space.

The contact fingers 13, 23, 33 and 43 are held in a block 127 of insulating material that is bolted to a vertical shaft 128 which extends through and is journaled in the panels 91 and 92 of the chassis 90. At a point intermediately of said panels the shaft 128 carries an arm 129 as shown in Figure 6. A contraction spring 130 tensioned between the free end of said arm and a suitably located stud 131 yieldably urges the shaft 128 in clockwise direction, as viewed in Figure 4 and thus presses the tips of the contact fingers yieldably against the program tape 55 at a point where said tape lies flat against the surface of the revolving drum 58. A cable 132 conducts the leads of the contact fingers 13, 23, 33 and 43 to a connection block 133 which has four contact screws to which are connected the leads of the tuning motor 80 (Figure 8), and of the switches 15, 25, 35 and 45 in the manner illustrated in Figure 3. The control relay 66 and the two switches 67 and 68 controlled by said relay, and also the rectifier 50 and the transformer 53, are likewise supported from the lower panel of the chassis as best shown in Figure 4.

Figure 7:
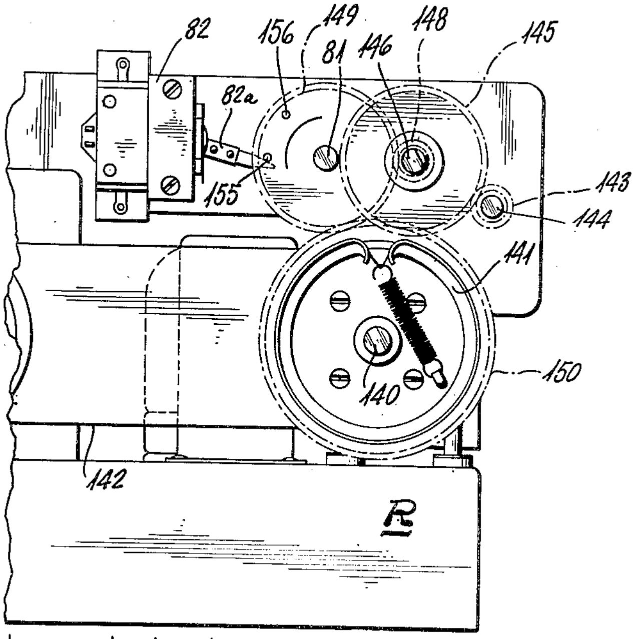
Figure 7 is a fragmentary front elevation of part of a radio receiver with the front panel removed to reveal the manner in which an automatic tuning device of the type represented by Figures 3 to 6 is associated with the tuning means of the receiver.
Figure 3:
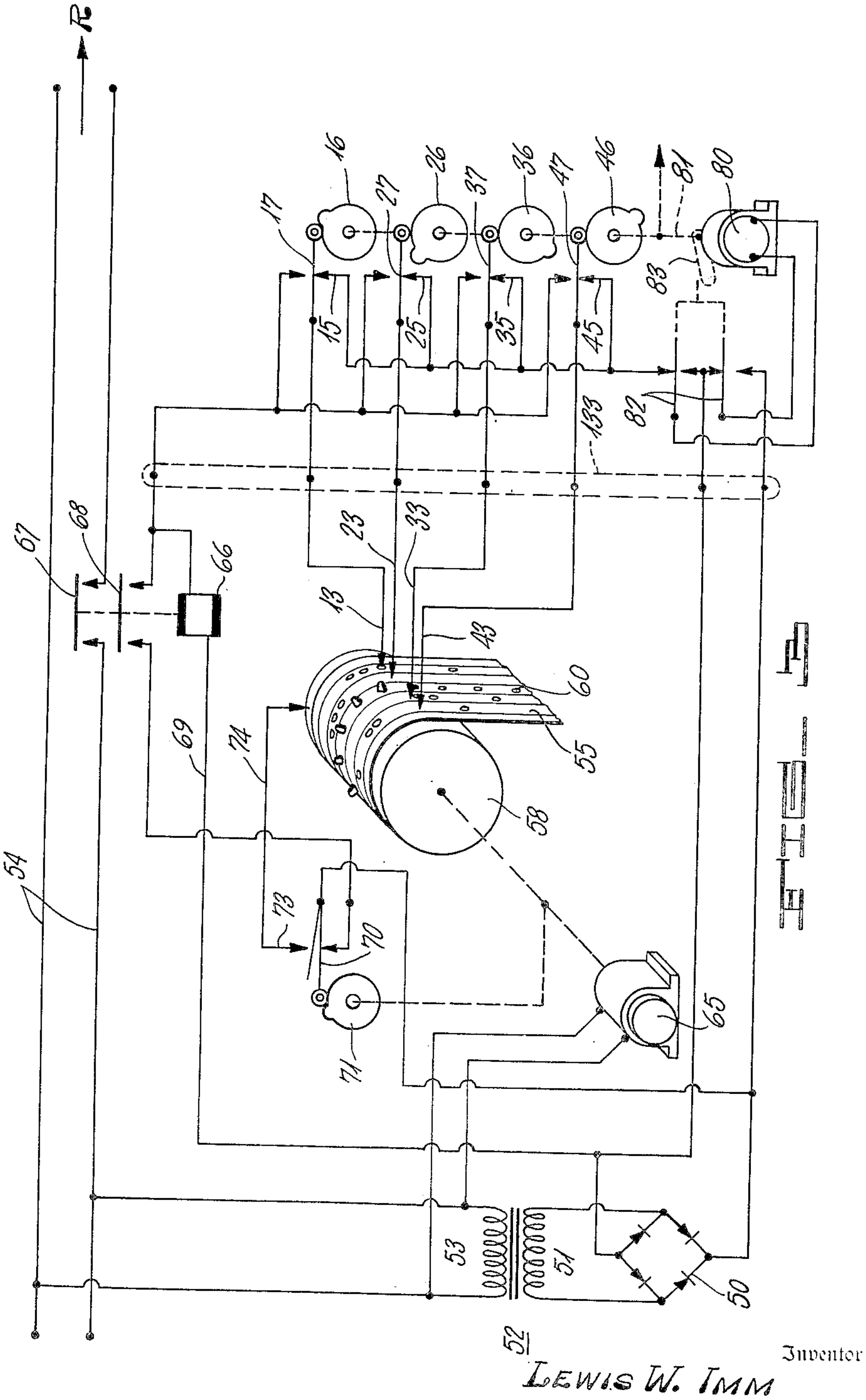
Figure 3:
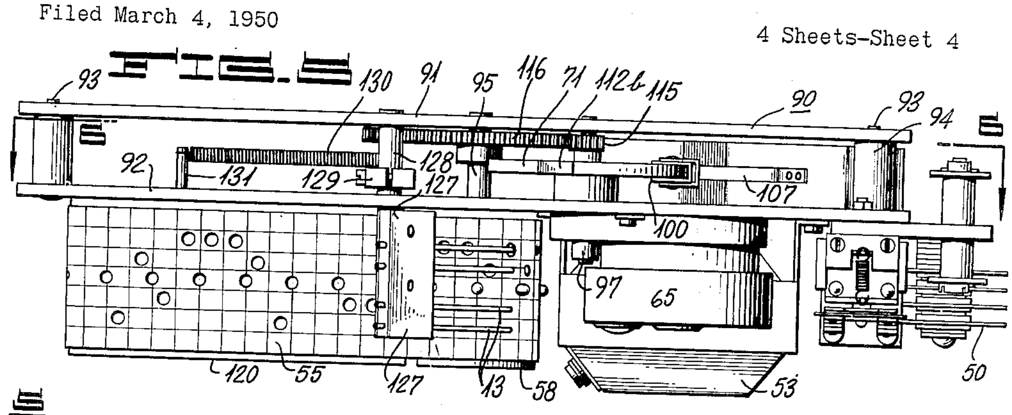

Figure 7 is a fragmentary front elevation of a radio receiver tuned by a variable capacity and illustrates the manner in which the tuning motion of a rotary condenser is controlled by the device shown in Figures 4, 5 and 6. The numeral 140 designates the condenser shaft and firmly mounted upon said shaft is a disk 141 over which is trained a cable 142 that connects said disk operatively with the indicator of the tuning dial (not shown) to visibly indicate on said dial the position of the tuning condenser. The condenser shaft 140 is driven from the tuning motor 80 (Figure 8) through a suitable train of reduction gears. Referring to both Figures 7 and 8, a small gear 143 is keyed to the power shaft 144 of the motor 80 and meshes with an idler gear 145 of large diameter that is firmly mounted upon a stub shaft 146 which is suitably journaled in the front wall of the receiver frame 147. Likewise mounted upon said stub shaft 146 for rotation in unison with the idler gear 145 is another small gear 148 which meshes with another gear 149 of large diameter that is firmly mounted upon the previously described cam shaft 81 which extends transversely across the frame of the radio receiver and is suitably journaled in the front and rear walls thereof, as shown in Figure 8. Said gear 149 meshes with another gear 150 that is keyed to the condenser shaft 140 and which may be pinned to the previously mentioned disk 141, as shown. Keyed upon the shaft 81 are four angularly displaced camming arms which constitute the previously described control cams 16, 26, 36 and 46, respectively. Associated with each of the camming arms 16, 26, 36 and 46, respectively, are the previously described double-throw switches 15, 25, 35 and 45, respectively. The contact arms 17, 27, 37 and 47 of said switches (Figure 3) are arranged to yieldably assume positions in which they lie within individual power circuits for the tuning motor 80 and from which they may be urged into positions in which they close individual circuits through the control relay 66 as previously explained. Riveted to the housings 15*a*, 25*a*, 35*a* and 45*a* of the aforementioned double throw switches are resilient actuator arms 18, 28, 38 and 48, respectively, which overlie push buttons 19, 29, 39 and 49 that bear against the yieldable contact arms 17, 27, 37 and 47 of the switches 15, 25, 35 and 45, respectively. Pivoted to the free ends of said actuator arms are rollers 18*a*, 28*a*, 38*a* and 48, respectively, that extend into the range of action of the camming arms, as best shown in Figure 9. Whenever a camming arm strikes against the roller on the actuating arm of the switch which it controls, the push button of said switch is depressed and causes its contact arm to open the motor circuit in which it is situated and close a power circuit through the relay 66. As a result thereof the motor, if it was powered through said switch, comes to a halt and leaves the receiver tuned to the station represented by the particular camming arm, and the relay 66 is energized to close the power switch 67 of the radio receiver and activate the holding circuit 69, as previously described. Whenever the motor resumes operation, however, and causes the camming arm to release its coacting push button, the contact arm of the particular switch returns to its original position in which it forms part of a power circuit through the motor 80 and interrupts the previously established circuit through the relay 66.

Suitably supported from the front wall of the receiver frame 147 is the previously described motor reversing switch 82 which may be of the toggle type and which has an actuating arm 82*a* that extends into the range of action of two angularly displaced studs 155 and 156 projecting laterally from the face of the aforementioned gear 149 that drives the cam shaft 81. The stud 155 may mark the full cycle position of the cam shaft 81 while stud 156 is angularly displaced from stud 155 by an arc which corresponds to a full sweep of the tuning condenser over all the stations to which the control device of my invention is capable of tuning the receiver, and which amounts to about 300 degrees in the exemplary embodiment of the invention illustrated in Figures 7 and 8. Thus, whenever the cam shaft has turned over an angle corresponding to the full tuning range covered by the control device of the invention, the stud 156 strikes against and actuates the arm of the toggle switch which connects the tuning motor directly across the source of power and causes instantaneous reversal in the operation of said motor as previously described; and after the cam shaft 81 has made nearly a full revolution in opposite direction, the other stud 155 strikes against the actuating arm 82*a* of the toggle switch from the opposite side which reverses the operation of the tuning motor again and reconnects the motor into the described motor control system. Thus the cam shaft 81 turns again in its initial direction, and when one of the camming arms actuates the motor stop switch over which the motor is energized at the moment, the tuning operation comes to a halt with the receiver set to the station represented by the tape perforation that initiated the described tuning operations.

The described device is compact and simple in construction and may readily be installed in any radio receiver, television receiver, or the like. When installed, the device permits desired programs to be selected for a whole day, a whole week or even a whole month, and the program selections may be recorded on its program tape with a minimum of effort since it is unnecessary to provide special perforations in the tape to activate the receiver whenever a desired performance is to commence or to switch it off whenever a desired program or sequence of programs has been concluded. Moreover, it is not necessary to be particularly careful in punching the program perforations into the tuning fields of the tape since the device of the invention is such as to tune in the desired stations accurately and at the proper moment, disregarding small irregularities in the positions of the perforations such as are bound to occur when laying out a program selection for extended periods of time, such as weeks or months.

While I have described my invention with the aid of a practical embodiment thereof, it will be understood that I do not wish to be limited to the particular constructional details shown and described that may be departed from without departing from the spirit and scope of my invention.

What I claim is:

1. An electrical switching system comprising a selector including switching means selectively operable to effect an electrical connection between a supply line and any of a plurality of control lines, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, and a common actuating device for said activating and holding switches operable to close said holding switch and thereafter open said activating switch.

2. An electrical switching system comprising a selector including switching means selectively operable to effect an electrical connection between a supply line and any of a plurality of control lines, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, and a common actuating device for said activating and holding switches operable to close said activating switch, open said holding switch, close said holding switch, and open said activating switch, seriatim.

3. An electrical switching system comprising a selector including switching means selectively operable to effect an electrical connection between a supply line and any of a plurality of control lines, a program control element associated with said selector for controlling said switching means according to a preselected sequence, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, and a common actuating device for said activating and holding switches operable to close said holding switch and thereafter open said activating switch.

4. An electrical switching system comprising a selector including switching means selectively operable to effect an electrical connection between a supply line and any of a plurality of control lines, a program control element associated with said selector for controlling said switching means according to a preselected sequence, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, and a common actuating device for said activating and holding switches operable to close said activating switch, open said holding switch, close said holding switch, and open said activating switch, seriatim.

5. An electrical switching system comprising a selector including switching means selectively operable to effect an electrical connection between a supply line and any of a plurality of control lines, a program control element associated with said selector for controlling said switching means according to a preselected sequence, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, a common actuating device for said activating and holding switches operable to close said holding switch and thereafter open said activating switch, and a common driving means for said selector and said actuating device.

6. An electrical switching system comprising a selector including switching means selectively operable to effect an electrical connection between a supply line and any of a plurality of control lines, a program control element associated with said selector for controlling said switching means according to a preselected sequence, an activating switch operable to effect an electrical connection between said supply line and a source of electrical energy, a power line adapted for connection to electrically powered apparatus and including a power control switch, means including a relay energized upon connection of any of said control lines to said source of electrical energy for closing said power control switch, means including a holding switch operable to close a circuit through said relay shunting said selector, and a common actuating device for said activating and holding switches operable to close said activating switch, open said holding switch, close said holding switch, and open said activating switch, seriatim.

LEWIS W. IMM.

No references cited.